United States Patent
Dor et al.

(10) Patent No.: US 6,714,884 B2
(45) Date of Patent: Mar. 30, 2004

(54) METHOD AND APPARATUS FOR PROVIDING COMMUNICATION BETWEEN A DEFECT SOURCE IDENTIFIER AND A TOOL DATA COLLECTION AND CONTROL SYSTEM

(75) Inventors: Amos Dor, Sunnyvale, CA (US); Maya Radzinski, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 09/978,300

(22) Filed: Oct. 15, 2001

(65) Prior Publication Data

US 2002/0069024 A1 Jun. 6, 2002

Related U.S. Application Data

(60) Provisional application No. 60/240,631, filed on Oct. 16, 2000.

(51) Int. Cl.⁷ .............................................. G06F 19/00
(52) U.S. Cl. ......................... 702/82; 702/81; 700/110; 438/7; 356/237.1
(58) Field of Search ............................. 702/82, 81, 84, 702/35; 700/110, 121; 438/7; 356/237.1; 156/345.13

(56) References Cited

U.S. PATENT DOCUMENTS

| | | | |
|---|---|---|---|
| 5,233,191 A | 8/1993 | Noguchi et al. | 250/306 |
| 5,528,510 A | 6/1996 | Kraft | 364/468 |
| 5,539,752 A | 7/1996 | Berezin et al. | 371/22.1 |
| 5,544,256 A | 8/1996 | Brecher et al. | 382/149 |
| 5,598,341 A | 1/1997 | Ling et al. | 364/468.17 |
| 5,761,064 A | 6/1998 | La et al. | 364/468.17 |
| 5,774,222 A | 6/1998 | Maeda et al. | 356/394 |
| 5,862,055 A | 1/1999 | Chen et al. | 364/468.28 |
| 5,923,430 A | 7/1999 | Worster et al. | 356/394 |
| 5,949,901 A | 9/1999 | Nichani et al. | 382/149 |
| 5,959,459 A | 9/1999 | Satya et al. | 324/751 |
| 5,966,459 A | 10/1999 | Chen et al. | 382/149 |
| 6,016,562 A | 1/2000 | Miyazaki et al. | 714/724 |
| 6,167,448 A | 12/2000 | Hemphill et al. | 709/224 |
| 6,314,379 B1 * | 11/2001 | Hu et al. | 702/81 |
| 6,408,219 B2 * | 6/2002 | Lamey et al. | 700/110 |
| 6,458,605 B1 * | 10/2002 | Stirton | 438/7 |
| 6,466,314 B1 * | 10/2002 | Lehman | 356/237.1 |
| 6,562,185 B2 * | 5/2003 | Avanzino et al. | 156/345.13 |

FOREIGN PATENT DOCUMENTS

| | | | | |
|---|---|---|---|---|
| EP | 0 910 123 | 4/1999 | | H01L/21/66 |
| EP | 0 932 194 | 7/1999 | | H01L/21/66 |
| WO | 99/59200 | 11/1999 | | H01L/21/66 |
| WO | 01/52319 | 7/2001 | | H01L/21/66 |

OTHER PUBLICATIONS

Written Opinion, Application No. SG200202598–9, Dated Apr. 2, 2003.
International Search Report, dated Nov. 15, 2002 for corresponding PCT/US01/32440.

* cited by examiner

*Primary Examiner*—John Barlow
*Assistant Examiner*—Hien Vo
(74) *Attorney, Agent, or Firm*—Moser Patterson & Sheridan

(57) ABSTRACT

A method and apparatus for providing communication between a defect source identifier and a tool data collection and control system. The defect source identifier collects wafer data until a defect is identified. Upon identification of a defect, a request is sent to the tool data collection and control system to request data of the tool parameters at the time the defect occurred. The tool data collection and control system retrieves the tool parameters and communicates them to the defect source identifier through a network. The tool parameters are processed by the defect source identifier to extract certain wafer data. The selected wafer data is communicated to the tool data collection and control system and is used to execute a prediction model to predict failure possible of the tool elements.

20 Claims, 4 Drawing Sheets

METHOD AND APPARATUS FOR PROVIDING COMMUNICATION BETWEEN A DEFECT SOURCE IDENTIFIER AND A TOOL DATA COLLECTION AND CONTROL SYSTEM

CROSS-REFERENCE TO RELATED APPLICATIONS

This application claims benefit of U.S. provisional patent application Ser. No. 60/240,631, filed Oct. 16, 2000, which is herein incorporated by reference.

BACKGROUND OF THE INVENTION

1. Field of the Invention

The present invention generally relates to semiconductor wafer processing systems and, more particularly, the invention relates to a method and apparatus for providing communications between a defect source identifier and a tool data collection and control system.

2. Description of the Background Art

Semiconductor wafer processing systems comprise a plurality of process chambers arranged to process semiconductor wafers in a serial manner to produce integrated circuits. As the wafers are processed, they are intermittently positioned in a metrology station or stations to measure the effectiveness of the process steps being performed. When defects are detected by the metrology station, the system operator is notified. The system operator then generally reviews empirical data to determine the source of the defect. Once the source is identified, the operator adjusts the operating parameters of the various chambers within the tool to mitigate future defects.

The defect source identification process may be automated using a defect source identifier as disclosed in U.S. patent application Ser. No. 09/905,607, filed Jul. 13, 2001, which is herein incorporated by reference. The defect source identifier collects data from the metrology station with regard to defects that are found on a wafer and analyzes the defects to automatically determine a source of those defects. Once the source is identified solutions to the source of defects can be suggested to an operator.

There is a need in the art for an integrated solution wherein the defect source identifier can communicate with a tool data collection and control system to create an automated process to predict tool failure and correct possible failures prior to actual failure.

SUMMARY OF THE INVENTION

The present invention generally provides a method and apparatus for providing communication between a defect source identifier (DSI) and a tool data collection and control system. The defect source identifier collects defect data until a defect is identified. Upon identification of a defect, a request is sent to a semiconductor wafer processing tool to request the tool parameters that were being used at the time the defect occurred. The tool data collection and control system retrieves the tool parameters and communicates them to the DSI through a network or other form of communication link. The defect source identifier (DSI) can then identify defect sources per chamber if the chamber information is provided by the tool data collection and analysis tool. The tool parameters are processed by the defect source identifier such that select wafer data is extracted that is relevant to the tool parameters at the occurrence of the defect. The select defect data is communicated to the tool data collection and control system. The data is used to execute a prediction model to predict failure occurrence of the tool components. If the model does not predict a failure of the tool or any component of the tool is imminent, the tool data collection and control system returns to its steady state. If a failure is predicted, the tool data collection and control system takes corrective action and then updates the defect source identifier with the action that is taken. To enhance accuracy of the invention, a data mining engine may be used to correlate defect data, tool parameter information (process data), and parametric data (e.g., electric test results).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
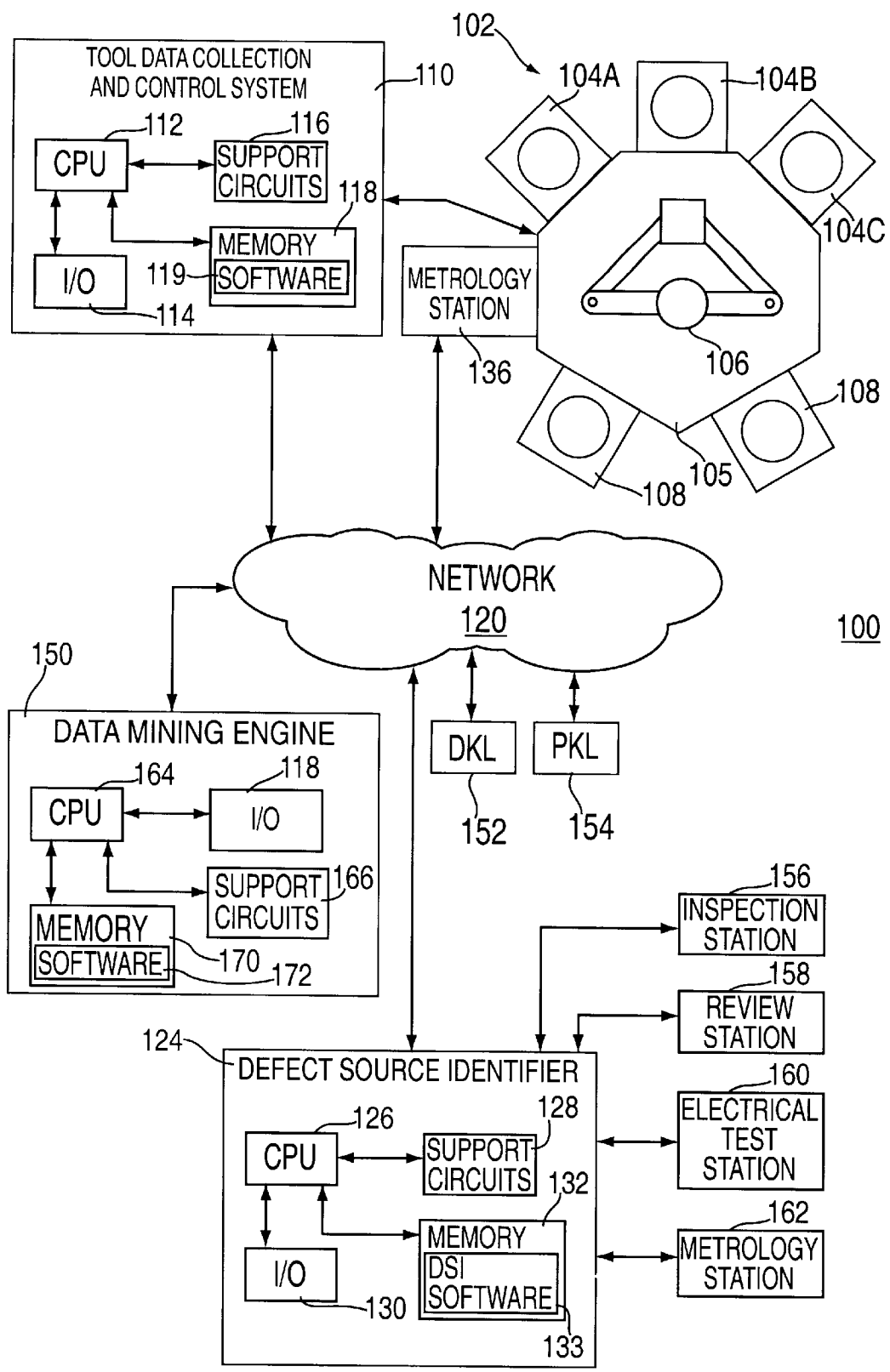
FIG. 1 is a block diagram of a semiconductor wafer processing system, according to an embodiment of the invention.

FIG. 1 depicts a block diagram of a semiconductor wafer processing system 100 comprising a semiconductor wafer processing tool 102 (the "tool"), a tool data collection and control system 110, a defect source identifier 124 and a communications network 120. Also coupled to the communications network 120 may be a data mining engine 150, a defect knowledge library (DKL) 152 and a process knowledge library (PKL) 154. The DKL and PKL can be combined into a single knowledge library.

The tool 102 comprises a plurality of process chambers 104A, 104B, and 104C attached to a platform 105. The platform 105 contains a centrally located robot 106 that accesses the process chambers 104A, 104B and 104C. The platform 105 also comprises a pair of load-locks 108 or other form of factory interface and at least one integrated metrology station 136. In some tools, the metrology station 136 may not be integrated, i.e., the station may be a stand-alone station 162. The tool 102 is controlled by the tool data collection and control system 110. The tool data collection and control system 110 provides control signals to control all of the process parameters and movement of wafers within the tool 102.

An example of a tool data collection and control system 110 that operates in accordance with the present invention is manufactured by Applied Materials, Inc. of Santa Clara, Calif. under the trademark SMARTSYS. This tool data collection and control system is described in U.S. patent application Ser. No. 09/561,440, filed Apr. 28, 2000, entitled "Wafer Fabrication Data Acquisition and Management Systems", which is incorporated herein by reference in its entirety.

The tool data collection and control system 110 comprises a central processing unit (CPU) 112, memory 118, input/output (I/O) circuits 114, and support circuits 116. The tool data collection and control system 110 is a general purpose computer that is programmed by software 119 stored in memory 118. When the software 119 is executed by the CPU 112, the computer operates as a specific purpose computing system that performs the processes of the tool data collection and control system 110. This CPU 112 is supported by well-known support circuits 116 such as clocks, power supplies, cache and the like. The I/O circuits 114 comprise such well-known components such as a mouse, keyboard and monitor as well as communications circuits such as Ethernet cards and other communications circuits. The memory 118 may comprise removable memory, random access memory, read only memory, hard disk drives or any combination thereof.

The defect source Identifier (DSI) 124 comprises a central processing unit (CPU) 126, a memory 132, I/O circuits 130 and support circuits 128. The defect source identifier 124 is similarly constructed as a general purpose computer as the tool data collection and control system 110 and operates in accordance with DSI software 133 stored in memory 132 and executed by the CPU 126. The DSI software 133 comprises executable instructions as well as information that is stored in various databases. An example of a DSI is described in U.S. patent application Ser. No. 09/905,607, filed July 13, 2001, which is incorporated herein by reference.

The DSI 124 receives defect information from a number of sources including one or more of an integrated metrology station 136, a stand-alone metrology station 162, a wafer inspection station 156, a wafer review station 158 and an electrical test station 160. The defect information is processed by the DSI software 133 and stored in the DSI memory 132 or stored in the defect knowledge library 152.

The tool data collection and control system 110 is coupled to the DSI 124 via a communications network 120. This network 120 may comprise a dedicated communication link between the DSI 124 and system 110 or may be a more conventional computer network such as Ethernet. Additionally, the metrology station or stations 136 are coupled to the DSI 124 by the network 120. Other tools and tool data collection and control systems may also be coupled via the network 120 to the DSI 124.

The tool data collection and control system 110 executes software 119 that provides control signals to the tool 102 to move the robot 106 such that wafers are sequentially moved from process chamber 104A, 104B, 104C to process chamber 104A, 104B, 104C to create integrated circuits or portions of integrated circuits. Intermittently during the process, a wafer (or wafers) is moved to the integrated metrology station 136 for analysis. Other test and measurement stations 156,158, 160,162 may also be used to create and supply defect information to the DSI 124. The station (or stations) tests the wafers for defects and reports those defects to the DSI 124.

The DSI 124 communicates wafer data to the tool data collection and control system 110 such that the tool data collection and control system 110 can use the DSI supplied information to predict a possible failure within the tool 102. Upon detection of a possible failure, the tool data collection and control system 110 may mitigate the failure by performing certain maintenance functions or produce operator warnings to avoid the failure. Any corrective action taken by the data collection and control system 110 is reported to the DSI 124 such that the DSI 124 can update its database of tool parameters. For example, if a chamber within the tool 102 is taken offline to avoid failure, the defect source identifier 124 must not identify that chamber as a source of defects in the future.

As described with respect to FIG. 3 below, the corrective process may be augmented using a data mining engine 150. In one illustrative embodiment, the data mining engine 150 is a general purpose computer comprising a CPU 164, support circuits 166, I/O circuits 168 and memory 170. The memory 170 stores data mining software 172 that, when executed by the CPU 164, causes the general purpose computer to operate as a special purpose computer (i.e., function as a data mining engine 150). The data mining engine 150 communicates with the DSI 124, system 110, DKL 152 and PKL 154 via the network 120. The engine 150 correlates tool information (process data) gathered by the tool data collection and control system 110 with DSI information (wafer data) gathered by the DSI 124. Upon finding operational parameter variations that correlate with wafer data, the engine 150 accesses the DKL 152 and PKL 154 to identify solutions to the identified defects, parameters and correlations. The correlation information can be used to augment the component failure prediction model. The process data, wafer data and correlation information may then be stored in the DKL and PKL to further enhance the historical records contained in these libraries.

Figure 2:
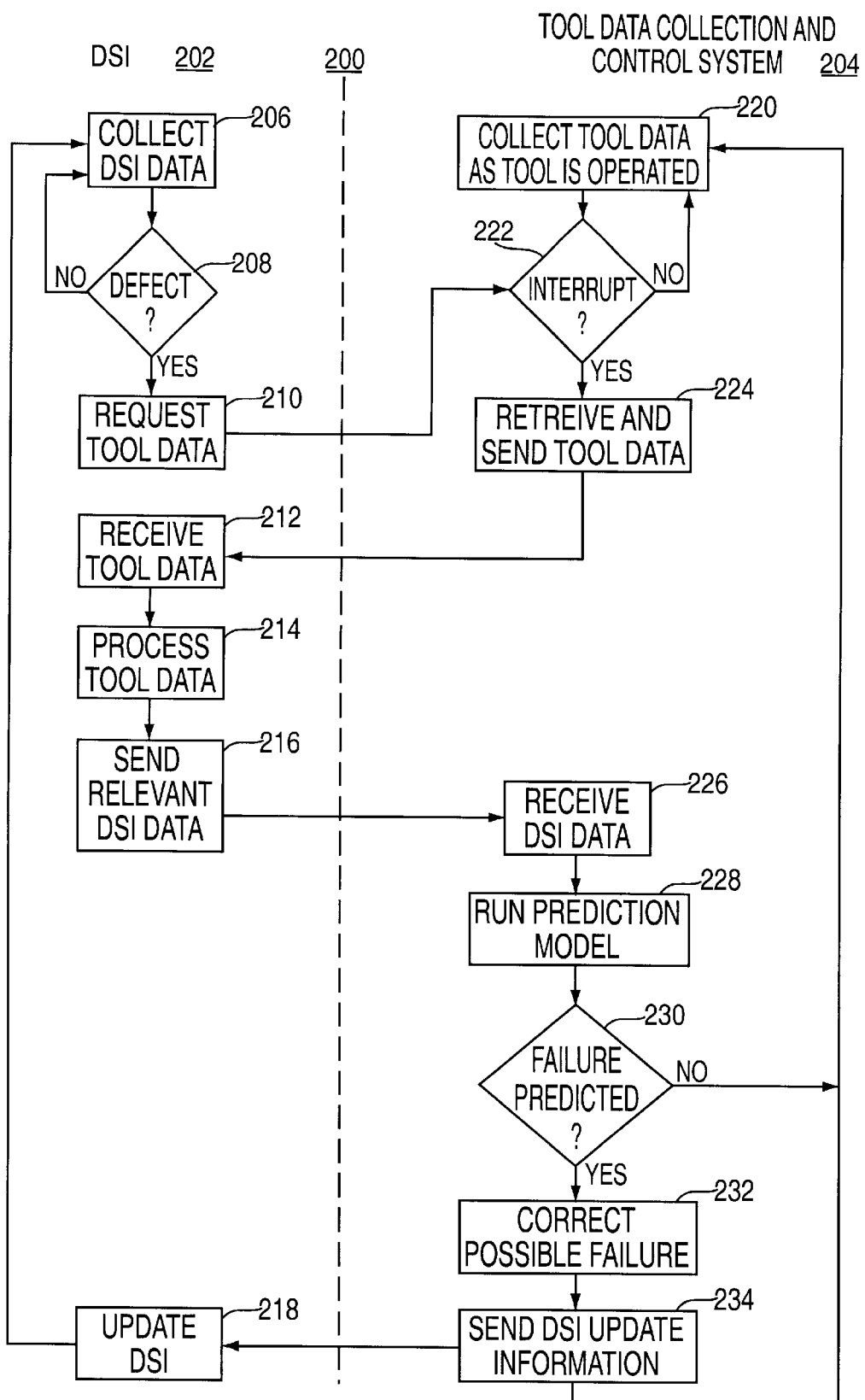
FIG. 2 is a flow diagram of a process according to an embodiment of the invention.

FIG. 2 depicts a flow diagram of a method 200 of a communication process between a DSI process 202 and a tool data collection and control system process 204. The steady state process for the DSI is to collect DSI data on a regular basis at step 206. The steady state process for the tool data collection and control process 204 is to collect tool data as the tool is operated in accordance with the control system at step 220.

When, at step 208, a defect is detected within the wafer data, the DSI process 202 proceeds to step 210 where the DSI process requests tool information (also referred to herein as tool data or process data) containing the operating parameters of the tool at the time the defect occurred. This request for tool data is sent to the tool data collection and control system through the network and forms an interrupt of the steady state operation of the tool data collection and control process 204. At step 222, the interrupt effectively causes the tool data collection and control system to retrieve and send tool data, at step 224, to the DSI process 202. The DSI process 202 receives the tool data at step 212 and processes that data at step 214. The processing at step 214 extracts select wafer data that is relevant to the tool's parameters at the time of the defect being detected.

At step 216, the select wafer data is sent to the tool data collection and control system. At step 226, the select wafer data is received and is used as input data to a failure prediction model that forms part of the software 119 of FIG. 1. One embodiment of a prediction model is manufactured by TRIAD Software of Ramsey, N.J., but other prediction models may be utilized. At step 228, the prediction model predicts whether a failure is imminent in one of the components within the tool. For example, the defect source identifier may identify a defect being caused by a particular chamber from the information given on the occurrence of the defect and the tool parameters at the time of the defect's occurrence as well as past parameters that have been collected. The tool data collection and control system can predict whether a certain chamber will fail. If at step 230, no failure is predicted the tool data collection and control system returns to its steady state process at step 220. However, if a failure is predicted, the process 204 proceeds to step 232 where a correction to the possible failure is performed. Such a correction may involve warning an operator of the imminent failure and having the operator correct some parameter of the process to avoid the failure. Alternatively, a particular defect may require a chamber to enter into a cleaning process or the like. Once the corrective action is taken, the action that was taken is communicated at step 234 to the DSI process 202. At step 218, the DSI process 202 updates the DSI databases with the corrective action taken by the data collection and control system. Upon updating the DSI databases, the tool data collection and control system returns to its steady state process at step 220. Similarly, after the DSI databases are updated with respect to the tool components that are operating and can be identified as sources of defects, the DSI process 202 returns to its steady state of collecting wafer data at step 206.

The tool data collection and control system, in lieu of sending a correction to the possible failure, may require additional information to be collected by the DSI. For example, the tool data collection and control system 110 may request the DSI 124 to collect more information from the metrology station 136 regarding a particular defect or change the sampling methodology or rates of sampling depending on the potential problem that has been identified. As such, the DSI 124 may collect information on additional wafers or it may more accurately analyze a defect on a particular wafer as requested by the data collection and control system.

Figure 3:
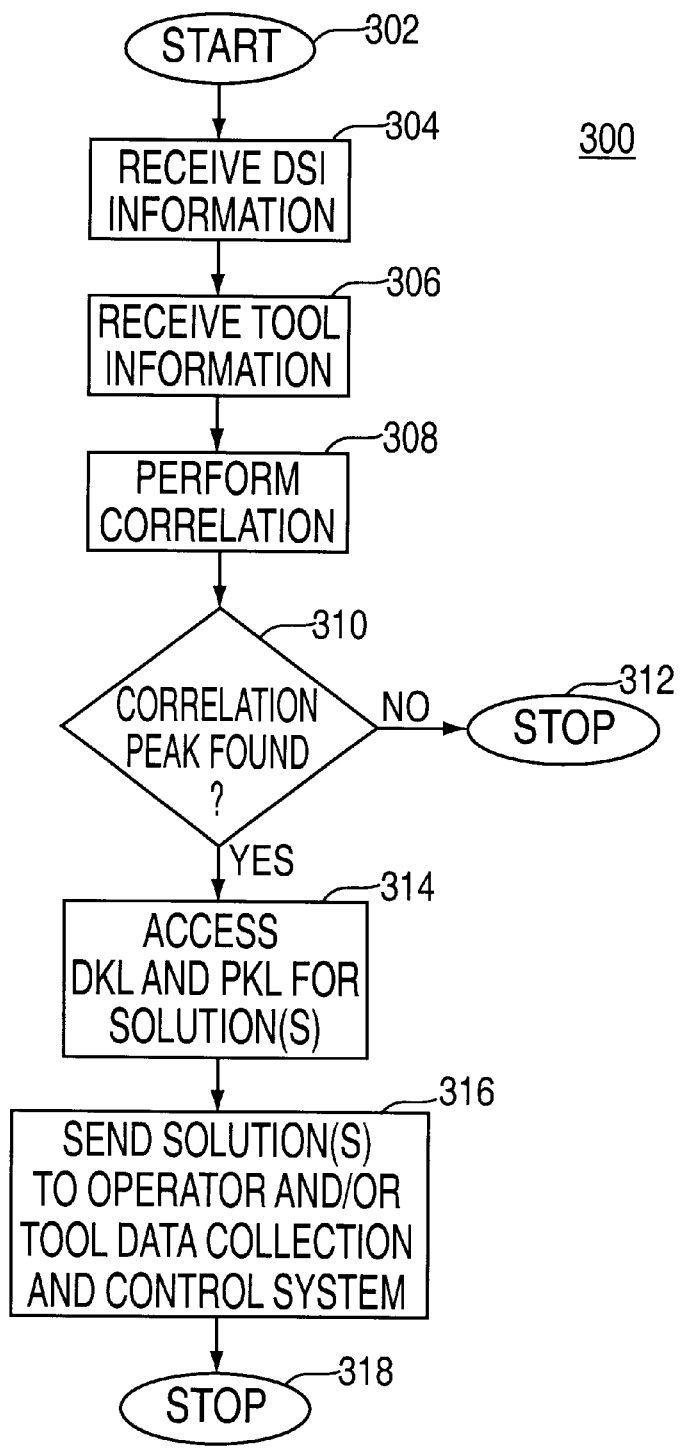
FIG. 3 is a flow diagram of a process used to correlate defect and process data, according to an embodiment of the invention.

FIG. 3 depicts a flow diagram of the method 300 of operation of the data mining engine 150 of FIG. 1. The method 300 begins with step 302 and proceeds to step 304. The method 300 may be invoked by an operator, automatically on a periodic basis, or automatically by the DSI 124 or tool data collection and control system 110. At step 304, the data mining engine receives DSI information and, at step 306, the data mining engine receives tool operation data (i.e., tool parameters).

Figure 4:
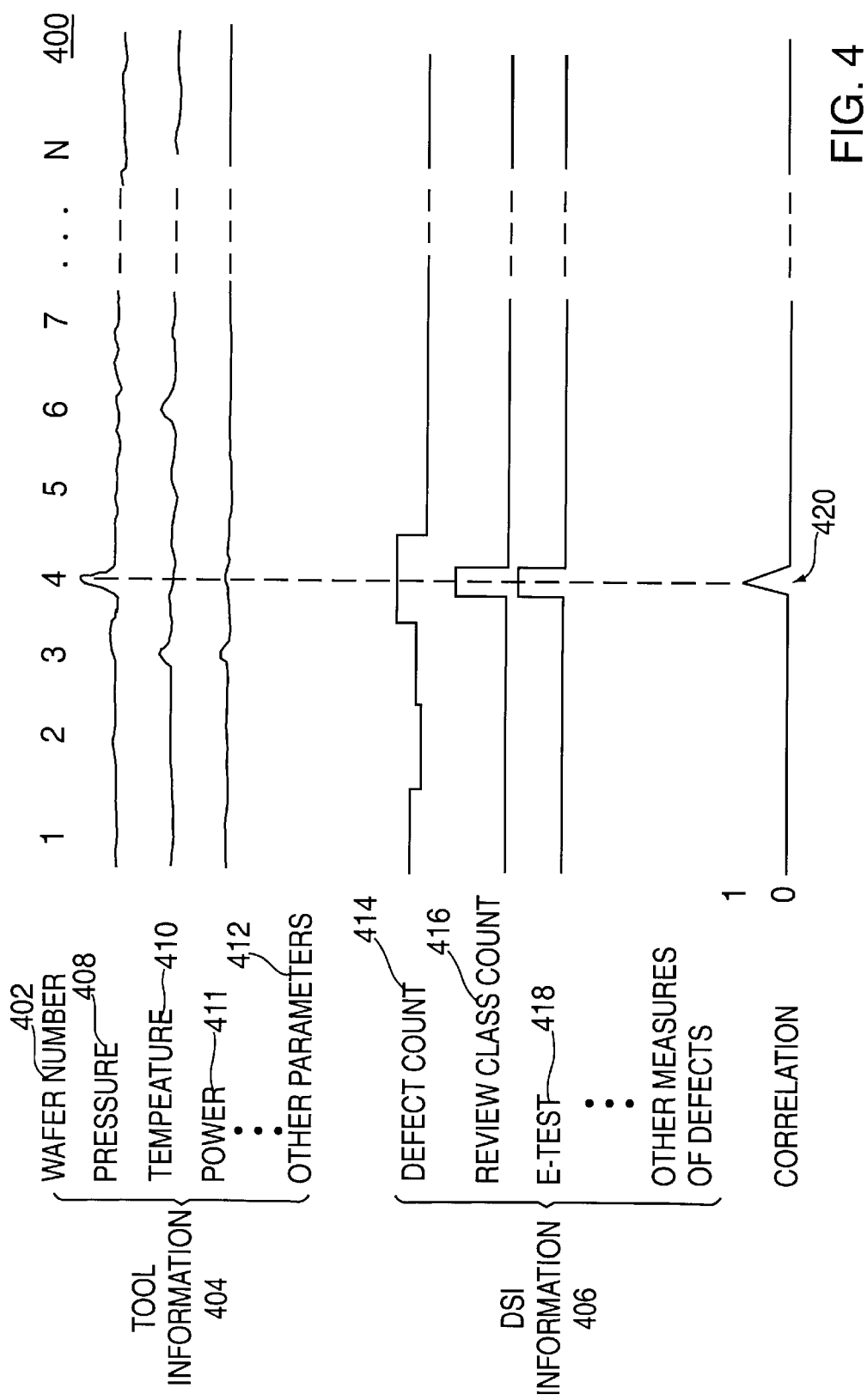
FIG. 4 is a graphical representation of defect and process data, according to an embodiment of the invention.

FIG. 4 is a table 400 that graphically illustrates the type of tool data (process data) and DSI information (wafer data) that is supplied to the data mining engine. The table comprises a wafer number 402, a tool information section 404 and a DSI information section 406. Illustrative tool data include pressure 408, temperature 410, power 411 and other parameter 412. Any number of parameters can be monitored and the information stored. Additionally, parameter processing can be performed to produce accumulated values, average values, peak values, filtered values and the like.

The DSI information section 406 comprises a defect count 414 for each wafer, a reviewer class count 416 (i.e., the number of defects in a particular defect class for a particular wafer), an electrical test 418 (e-test) count of defective dies on a wafer and so on. Any number of defect measures can be used. Additionally, the defect measures may be processed to form accumulations, averages, filtered values, and the like.

In step 308 of FIG. 3, method 300 correlates selected data parameters with selected defect measures. This processing identifies relationships between the parameters and the defects. As illustrated in FIG. 4, the pressure data 408 spikes at wafer 4, while all the defect measures also rise for wafer 4. This results in a correlation peak 420. Conversely, fluctuations in temperature 410 and power 411 do not correlate with an increase in defects. As such, no correlation peak is produced for wafer 3.

At step 310, the method 300 queries whether a correlation peak has been found. If the query is negatively answered, the method proceeds to step 312 and stops. If the query is affirmatively answered (as in the case of wafer 4 in FIG. 4), the method 300 proceeds to step 314. At step 314, the method accesses the defect knowledge library (DKL) and the process knowledge library (PKL). The DKL contains information regarding the defects that led to the correlation and solutions for mitigating the defects. The PKL contains process information that can be used to ensure that the solution suggested by the DKL information can be used in the process being performed by the tool.

After one or more solutions have been suggested, the method 300 proceeds to step 316 wherein the solutions are sent to an operator and/or to the tool data collection and control system for implementation. At step 318, the method stops.

While the foregoing is directed to the preferred embodiment of the present invention, other and further embodiments of the invention may be devised without departing from the basic scope thereof, and the scope thereof is determined by the claims that follow.

What is claimed is:

1. Apparatus for processing a semiconductor wafer comprising:
   a semiconductor wafer processing tool;
   a defect source Identifier, coupled to at least one metrology station, for collecting wafer data from wafers that are processed in the defect source identifier;
   a tool data collection and control system coupled to the defect source identifier and the semiconductor wafer processing tool, for predicting component failure within the semiconductor wafer processing tool in response to the wafer data collected by the defect source identifier; and
   a data mining engine coupled to the defect source identifier and the tool data collection and control system, wherein the data mining engine correlates the wafer data with process tool data collected by the tool data collection and control system.

2. The apparatus of claim 1 wherein said tool data collection and control system produces control signals for the semiconductor wafer processing tool.

3. The apparatus of claim 2 wherein said control signals are used to avoid component failure in the semiconductor wafer processing tool.

4. The apparatus of claim 1 further comprising a communications network connecting the defect source identifier to the tool data collection and control system.

5. The apparatus of claim 1 wherein said metrology station is Integrated into the semiconductor wafer processing tool.

6. The apparatus of claim 1 wherein the defect source identifier is coupled to at least one of a wafer review station, an electrical test station, and an inspection station, which provide additional wafer data.

7. The apparatus of claim 1 wherein wafer data comprises defect data.

8. The apparatus of claim 1 further comprising a defect knowledge library coupled to said defect source identifier.

9. The apparatus of claim 1 further comprising a process knowledge library coupled to said defect source identifier.

10. The apparatus of claim 1 further comprising a knowledge library containing defect and process information, coupled to said defect source identifier.

11. A method of processing a semiconductor wafer comprising:
processing the semiconductor wafer in a semiconductor wafer processing tool;
collecting wafer data regarding defects on the semiconductor wafer;
collecting process data regarding process parameters used during processing of the semiconductor wafer; and
predicting failure of a component of semiconductor wafer processing tool in response to data using a data mining engine coupled to the defect source identifier and the toot data collection and control system to correlate the wafer data and the process data.

12. The method of claim 11 further comprising:
adjusting the semiconductor wafer processing tool to avoid the predicted component failure.

13. The method of claim 11 further comprising:
correlating the wafer data with the process data to enhance the prediction accuracy.

14. The method of claim 11 wherein the wafer data is produced using at least one of a wafer review station, a wafer inspection station, an electrical test station, or a metrology station.

15. The method of claim 11 further comprising:
storing the wafer data in a defect knowledge library and storing the process data in a process knowledge library.

16. A method of processing a semiconductor wafer comprising:
processing the semiconductor wafer in a semiconductor wafer processing tool;
collecting wafer data regarding defects on the semiconductor wafer using a defect source identifier;
collecting process data regarding process parameters used during processing of the semiconductor wafer using a tool data collection and control system;
communicating the wafer data to the tool data collection and control system; and
predicting failure of a component of semiconductor wafer processing tool in response to data the wafer data and the process data.

17. The method of claim 16 further comprising:
requesting additional wafer data to be collected by the defect source identifier and communicated to the tool data collection and control system.

18. The method of claim 16 further comprising:
adjusting the semiconductor water processing tool to avoid the predicted component failure.

19. The method of claim 16 further comprising:
correlating the wafer data with the process data to enhance the prediction accuracy.

20. The method of claim 16 wherein the wafer data is produced using at least one of a wafer review station, a wafer inspection station, an electrical test station, or a metrology station.

* * * * *